United States Patent [19]
Lin et al.

[11] Patent Number: 6,130,151
[45] Date of Patent: Oct. 10, 2000

[54] METHOD OF MANUFACTURING AIR GAP IN MULTILEVEL INTERCONNECTION

[75] Inventors: Shih-Chi Lin, Taipei; Yen-Ming Chen, Hsin-Chu; Juin-Jie Chang, Wanchu Valley; Kuei-Wu Huang, Hsin-Chu, all of Taiwan

[73] Assignee: Taiwan Semiconductor Manufacturing Company, Hsin-Chu, Taiwan

[21] Appl. No.: 09/307,208

[22] Filed: May 7, 1999

[51] Int. Cl.[7] ................ H01L 21/4763; H01L 21/764
[52] U.S. Cl. ............ 438/619; 438/411; 438/421; 438/422; 438/611; 438/626; 438/631; 438/634; 438/738; 438/739; 438/740; 257/522
[58] Field of Search .................. 438/619, 622, 438/688, 192, 620, 623, 626, 627, 628, 629, 631; 257/522

[56] References Cited

U.S. PATENT DOCUMENTS

| | | | |
|---|---|---|---|
| 4,933,743 | 6/1990 | Thomas et al. | 357/71 |
| 5,000,818 | 3/1991 | Thomas et al. | 156/643 |
| 5,117,276 | 5/1992 | Thomas et al. | 357/71 |
| 5,232,866 | 8/1993 | Beyer et al. | 438/619 |
| 5,324,683 | 6/1994 | Fitch et al. | 437/65 |
| 5,407,860 | 4/1995 | Stoltz et al. | 437/180 |
| 5,439,823 | 8/1995 | Nakamura | 438/192 |
| 5,444,015 | 8/1995 | Aitken et al. | 437/182 |
| 5,461,003 | 10/1995 | Havemann et al. | 437/187 |
| 5,476,817 | 12/1995 | Numata | 438/619 |
| 5,510,293 | 4/1996 | Numata | 438/622 |
| 5,521,122 | 5/1996 | Kuramochi | 29/832 |
| 5,559,055 | 9/1996 | Chang et al. | 438/586 |
| 5,599,654 | 2/1997 | Kudo | 430/324 |
| 5,641,712 | 6/1997 | Grivna et al. | 438/624 |
| 5,668,398 | 9/1997 | Havemann et al. | 257/522 |
| 5,708,303 | 1/1998 | Jeng | 257/758 |
| 5,750,415 | 5/1998 | Gnade et al. | 438/618 |
| 5,753,523 | 5/1998 | Giedd et al. | 438/610 |
| 5,818,699 | 10/1998 | Fukuoka | 361/760 |
| 5,863,832 | 1/1999 | Doyle et al. | 438/622 |
| 5,880,018 | 3/1999 | Boeck et al. | 438/619 |
| 5,880,026 | 3/1999 | Xing et al. | 438/688 |
| 5,949,143 | 9/1999 | Bang | 257/758 |
| 5,949,654 | 9/1999 | Fukuoka | 361/760 |
| 5,950,102 | 9/1999 | Lee | 438/619 |
| 6,022,802 | 2/2000 | Jang | 438/656 |
| 6,051,491 | 4/2000 | Ito | 438/619 |

FOREIGN PATENT DOCUMENTS

0872887  10/1998  European Pat. Off. ........ H01L 23/48

*Primary Examiner*—Tom Thomas
*Assistant Examiner*—Bernard E. Souw
*Attorney, Agent, or Firm*—George O. Saile; Stephen B. Ackerman

[57] ABSTRACT

A method for forming a semiconductor device having air regions, the method comprises providing a base, forming a pattern of metal leads, depositing a layer of oxide over the metal leads, forming a layer of nitride over said layer of oxide, opening and etching a trench down to the base layer of material, and depositing and planarizing a dielectric layer. An alternate approach teaches the deposition of a layer of SOG over the layer of oxide that has been deposited over the metal leads, planarizing this layer of SOG down to the top of the metal leads, depositing a layer of PECVD oxide, patterning and etching this layer of PECVD oxide thereby creating openings that are in between the metal leads. The SOG that is between the metal leads can be removed thereby creating air gaps as the intra-level dielectric for the metal leads.

35 Claims, 6 Drawing Sheets

METHOD OF MANUFACTURING AIR GAP IN MULTILEVEL INTERCONNECTION

BACKGROUNG OF THE INVENTION (1) Field of the Invention

The invention relates to the fabrication of Integrated Circuit devices and more specifically to the formation of air gaps as a low dielectric constant material between conductor lines on the same or on different levels.

(2) Description of the Prior Art

The formation of air gaps between conducting lines of high speed Integrated Circuits (IC's) is typically a combination of the deposition of a metal layer, selective etching of the metal layer to form the desired line patterns, the deposition of a porous dielectric layer or a disposable liquid layer which is then selectively removed to form the desired air-gaps.

The continuing effort to reduce the size of individual transistors and other devices commonly integrated on a semiconductor chip and to increase the density of Integrated Circuits results in a continuing reduction of the separation between conducting layers of materials. This reduction results in an increase of capacitive crosstalk between adjacent conductor lines of a semiconductor circuit, that is the voltage on the first conductor line alters or affects the voltage on the second conductor line. This alteration in voltage can cause erroneous voltage levels in the Integrated Circuit making the IC increasingly prone to faulty operation. It becomes therefore imperative to reduce the resistive capacitance (RC) time constant and the crosstalk between adjacent conducting lines.

The capacitance between adjacent conducting lines is highly dependent on the insulator or dielectric used to separate the conducting lines. Semiconductor fabrication typically uses silicon dioxide as a dielectric; this has a dielectric constant of about 3.9.

The use of many of the low dielectric constant materials is not feasible due to the fact that equipment is not available to properly process the new dielectric material in various integrated circuits. Also, the chemical or physical properties of many low dielectric constant materials are usually difficult to make compatible with or integrate into integrated circuit processing.

The lowest possible and therefore the ideal dielectric constant is 1.0, this is the dielectric constant of a vacuum whereas air has a dielectric constant of less that 1.001.

To reduce said capacitive coupling and reduce the capacitive crosstalk, a major objective in the design of IC's is to reduce the Dielectric Constant (k) of the insulating layer between adjacent conductor lines of semiconductor circuits. The present invention makes a significant contribution within the scope of this effort.

U.S. Pat. No. 5,324,683 (Fitch et al.) shows a method for forming an air gap between metal lines by forming a dielectric layer between metal lines, forming an etch barrier layer(s) thereover and opening a hole in the etch barrier layer and isotropically etching the dielectric layer to form air gaps. This is close to the invention. However, the exact structures/steps differ.

U.S. Pat. No. 5,461,003 (Havemann et al.) teaches air gap process by forming a porous layer over an oxide layer; and isotropically etching the oxide layer between the metal lines to form air gaps.

U.S. Pat. No. 5,641,712 (Grivna et al.) shows a process to form air gaps between line by growing oxide.

U.S. Pat. No. 5,407,860 (Stoltz et al.) disclose an air gap process by etching low-k material out between lines and forming a dielectric layer thereover.

U.S. Pat. No. 5,444,015 (Aitken et al.) shows a method for forming air gap between metal lines by removing the dielectric material between the lines.

SUMMARY OF THE INVENTION

The principle object of the present invention is to provide and effective and manufacturable method of forming air gaps between conductive layers of material.

Another objective of the present invention is a method of reducing the dielectric constant k between conductive layers of material.

Another objective of the present invention is a method of reducing capacitive coupling between conducting layers of material.

Another objective of the present invention is a method of reducing capacitive crosstalk between conductive layers of material.

Another objective of the present invention is to reduce the potential for false or incorrect logic levels of the circuits in the IC's.

Another objective of the present invention is a method of reducing Resistive Capacitive delays of the circuits in the IC's.

Another objective of the present invention is to increase Switching Speed of the circuits in the IC's.

Another objective of the present invention is to provide a method for simplification of the semiconductor planarization process by means of the elimination of dummy blocks within the construct of the semiconductor circuits.

In accordance with the objects of the present invention a new method of forming air gaps between adjacent conducting lines of a semiconductor circuit is achieved.

The first embodiment of the present invention addresses, in accordance with the above stated objectives, a method for manufacturing air gaps in multilevel interconnections, comprising the steps of forming metal leads on top of an insulating layer, performing a Chemical Vapor Deposition (CVD) of oxide over the metal leads, performing a CVD of nitride over the layer of oxide, open a trench through the deposited nitride and into the deposited oxide down to a level not reaching the insulating layer, etch the trench down to the level of the insulating layer at the same time widening the trench, deposit a low step coverage of a dielectric layer on top of the nitride such that the dielectric does not penetrate the trench, perform Chemical Mechanical Planarization of the deposited dielectric down through the top layer of the deposited nitride, etch to remove the remaining nitride and deposit a low step coverage of dielectric material to enclose the air gap formed within the trench and the areas of the removed nitride.

The second embodiment of the present invention addresses, in accordance with the above stated objectives, a method for manufacturing air gaps in multilevel interconnections that encompasses the steps as indicated above within the first embodiment of the present invention but where the process of creating air gaps does not extend the step of CMP of the deposited dielectric down through the top layer of the deposited nitride. Under the second embodiment of the present invention, the air gap will be formed between the metal leads.

The third embodiment of the present invention comprises the steps of forming metal leads on top of an insulating layer, performing a Plasma Enhanced Chemical Vapor Deposition (PECVD) of oxide over the metal leads, performing a CVD of SOG over the layer of oxide, planarize the deposited layer of SOG down to below the top surface of the deposited PECVD oxide, deposit a thin layer of PECVD oxide over the planarized surface of the layer of SOG, open holes through the deposited PECVD oxide, etch the deposited SOG by vapor HF through the holes in the PECVD oxide down to the level of the insulating layer at the same time widening the openings in the SOG, remove the photoresist and deposit a low step coverage of a dielectric layer on top of the PECVD oxide such that the dielectric does not penetrate the openings in the PECVD oxide, perform curing of the deposited dielectric on top of the PECVD.

BRIEF DESCRIPTION OF THE DRAWINGS

FIGS. 10 through 17 address the third embodiment of the invention, as follows:

DETAILED DESCRIPTION OF THE PREFERRED EMBODIMENT

Figure 1:
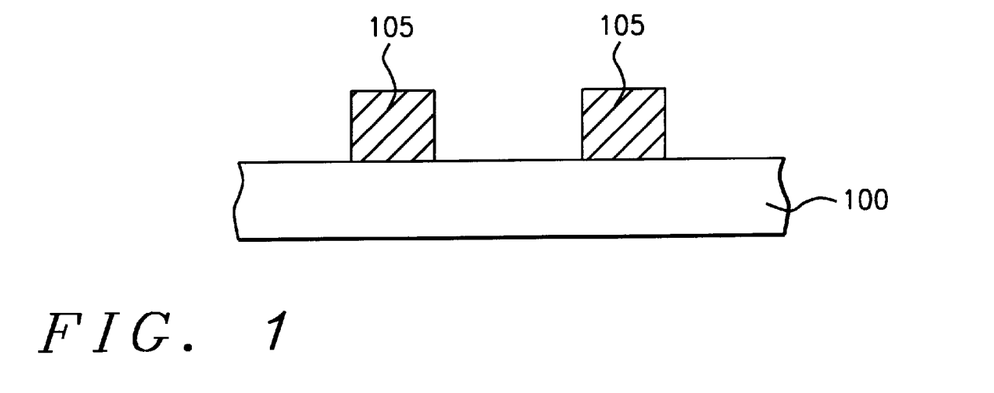
FIG. 1 shows a cross section of the insulating layer with two metal leads formed on top of the insulating layer.

Referring now more specifically to FIG. 1, there is shown the insulating layer 100 with two metal leads 105 deposited on top of the insulating layer. The method of deposition of the metal leads uses standard PVD techniques that are well known within the state of the art of semiconductor manufacturing.

Figure 2:
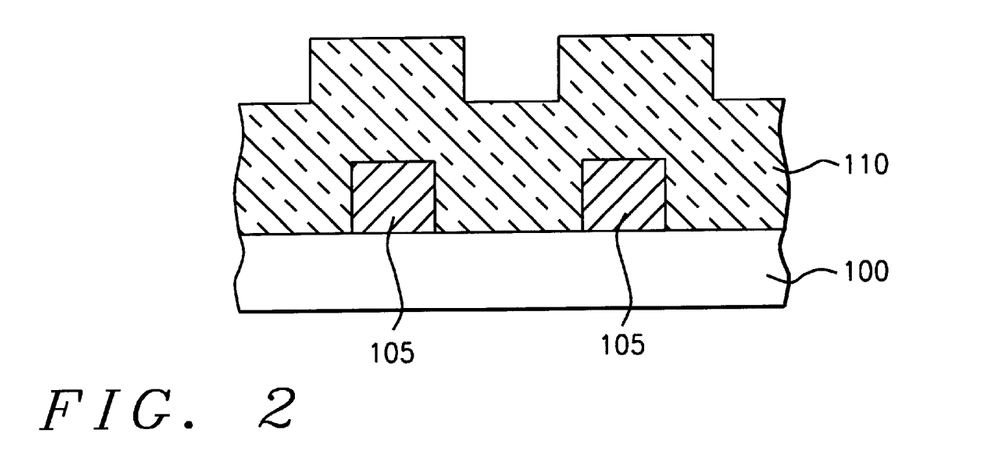
FIG. 2 shows a cross section after an oxide layer has been deposited.

FIG. 2 shows the cross section after the oxide layer 110 has been deposited. The method of deposition for this oxide layer uses standard CVD techniques. Layer 110 can also consist of a low k dielectric material.

Figure 3:
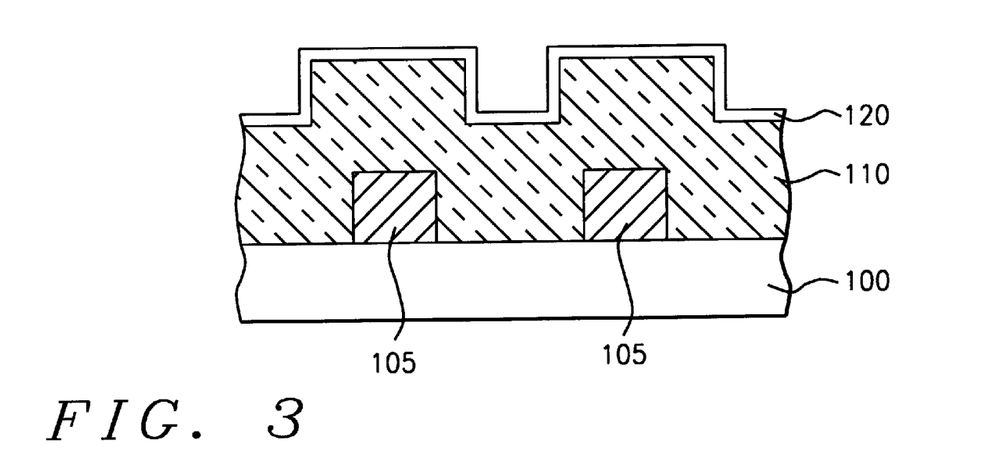
FIG. 3 shows a cross section after a layer of nitride has been deposited.

FIG. 3 shows the deposition of the layer of nitride 120 ($Si_xN_y$) on top of the oxide layer 110. Again standard, state of the art deposition techniques can be used for this deposition.

Figure 4:
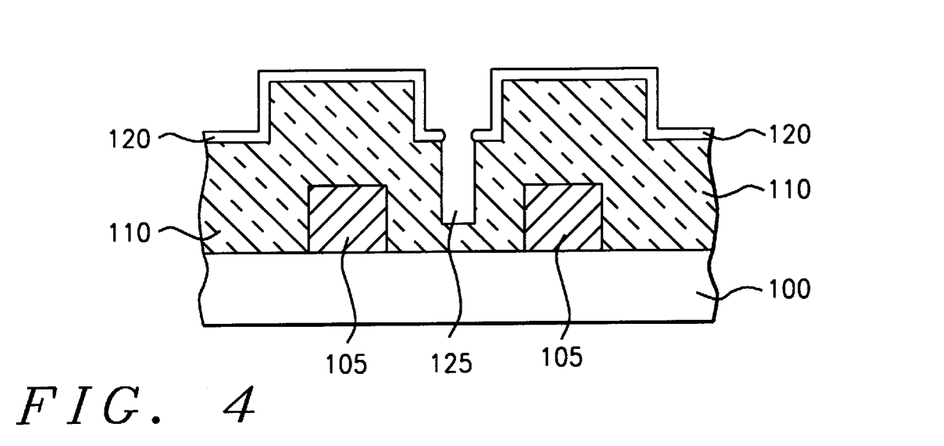
FIG. 4 shows a cross section after the initial opening of a trench.

FIG. 4 shows the opening of a trench 125 that penetrates through the deposited nitride 120 and into the layer of oxide 110 without however reaching the top surface of the insulating layer 110. The standard techniques of photo lithography and Reactive Ion Etching (RIE) can be used for this processing step.

Figure 5:
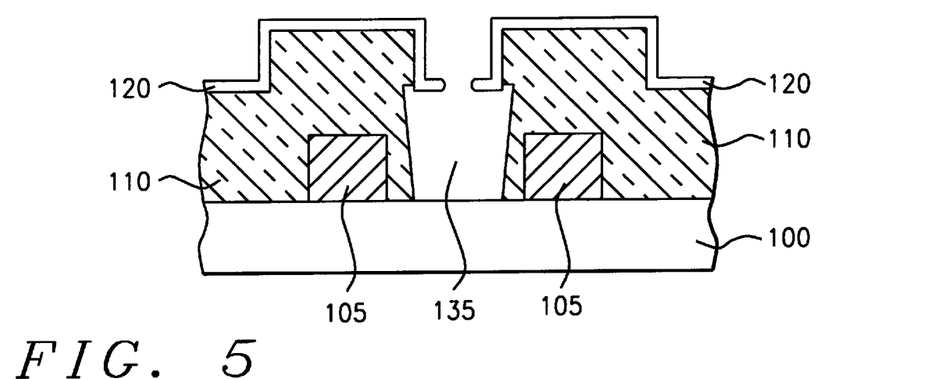
FIG. 5 shows a cross-section after the wet etch of the deposited oxide.

FIG. 5 shows the results of a wet or isotropic etch applied to the oxide layer 110. Trench 135 is made wider so that it partially penetrates under the nitride layer 120 while the depth of the trench has been extended to penetrate all the way to the top surface of the insulating layer 100.

Figure 6:
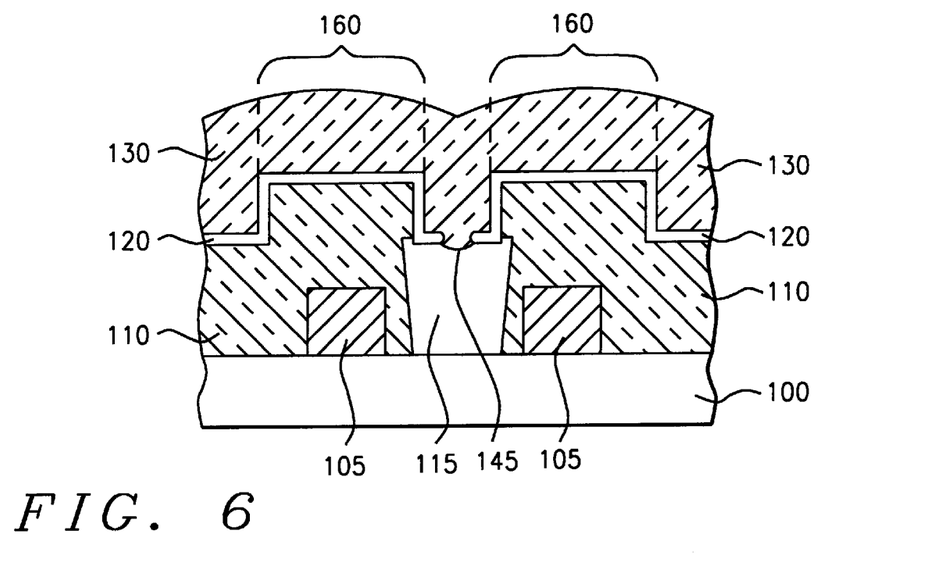
FIG. 6 shows a cross section after a dielectric layer has been deposited on top of the nitride.

FIG. 6 shows the deposition of dielectric layer 130 on top of the nitride layer 120. The express purpose of the dielectric 130 is to cover the gap 145 of the trench 115. The dielectric used for this purpose can be phosphosilicate (PSG), this dielectric must cover gap 145 without penetrating into the trench 115. The trench 115 is now closed and, which is of prime importance to the objectives of the present invention, contains air as a medium. The tops 160 are highlighted for further explanation under the following FIG. 7.

Figure 7:
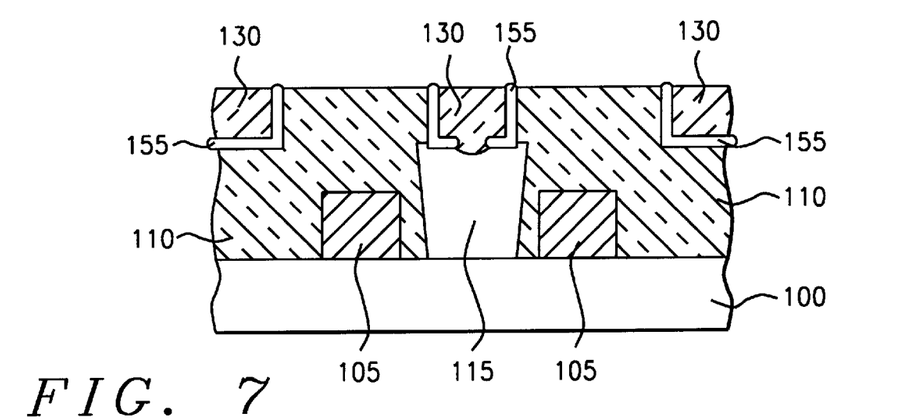
FIG. 7 shows a cross section after the deposited dielectric has been planarized down through the top surface of the nitride layer.

FIG. 7 shows the results of the planarization of the dielectric layer 130 and the top surfaces 160 of the nitride layer 120. This step makes access to the remainder of the nitride, highlighted as 155, possible.

Figure 8:
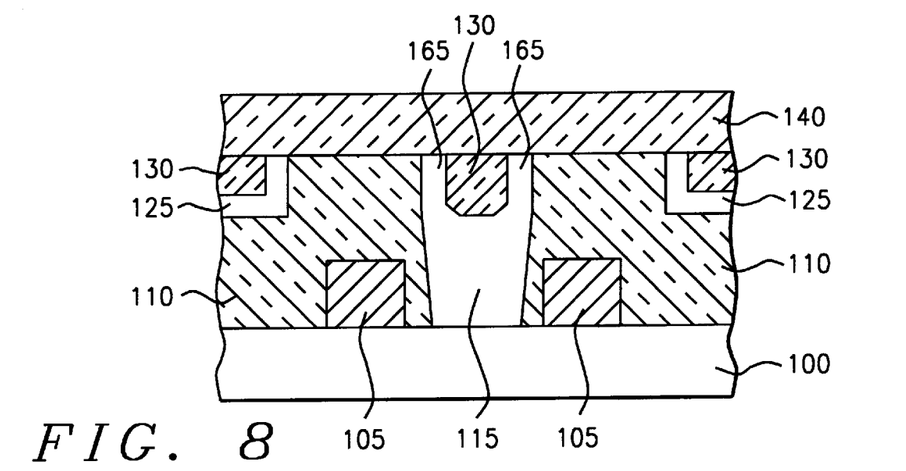
FIG. 8 shows a cross section after the remaing nitride has been removed and a dielectric layer has been deposited over the structure.

FIG. 8 shows the formation of the second air gaps 125. These second air gaps 125 are formed by removing the remainder of the nitride 155 (FIG. 7). This removal is accomplished by using hot $H_3PO_4$ acid for the etching process. The removal of the nitride 155 (FIG. 7) extends the cavity 115 with two upwards reaching channels or cavities 165 as shown in FIG. 8. FIG. 8 further shows the deposition of a dielectric layer 140 on top of the structure. The dielectric layer 140 covers the gaps 125 as well as the extended channels 165 of the extended cavity 115. The cavities 115 and 125 are now enclosed and form an effective and low k dielectric interface between the metal lines after the dielectric layer 140 has been deposited.

Figure 9:
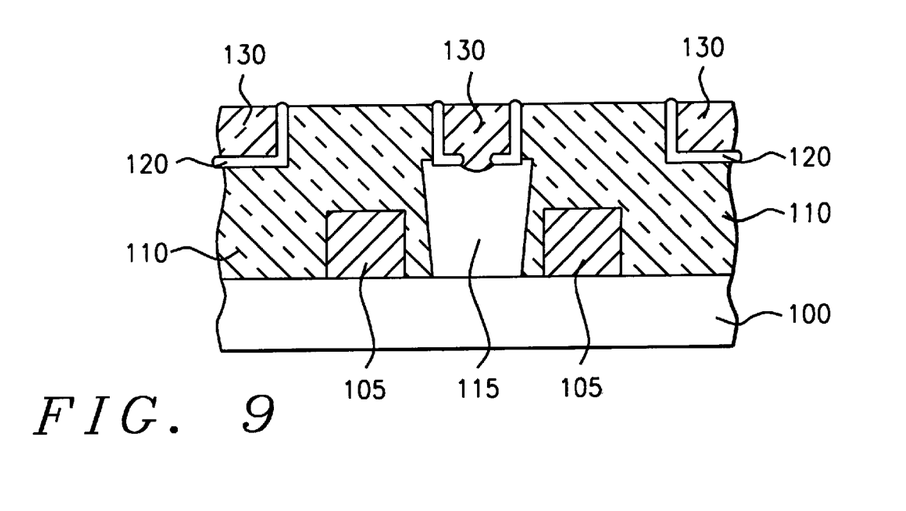
FIG. 9 shows a cross section of the structure obtained if the process is carried no further than the previously indicated step of planarizing the dielectric, FIG. 7.

FIG. 9 shows the results that are obtained is the previously highlighted processing steps are not carried beyond the step of the indicated planarization of the deposited layer of dielectric 130. This lead to process simplification and therefore reduction of cost of implementation of the present invention while still creating an effective air gap 115 between the electric leads 105.

FIGS. 10 through 17 address the third embodiment of the invention.

Figure 10:
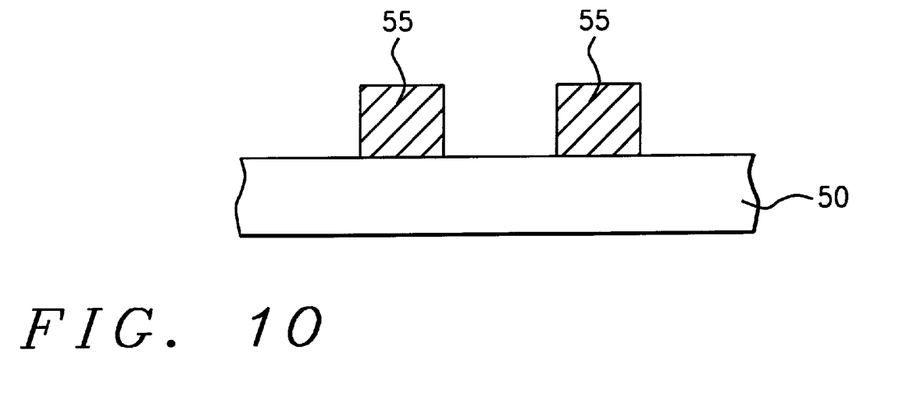
FIG. 10 shows a cross section of the insulating layer with two metal leads formed on top of the insulating layer.

FIG. 10 shows a cross section of the formation of the metal lines 55 on top of an insulating layer 50.

Figure 11:
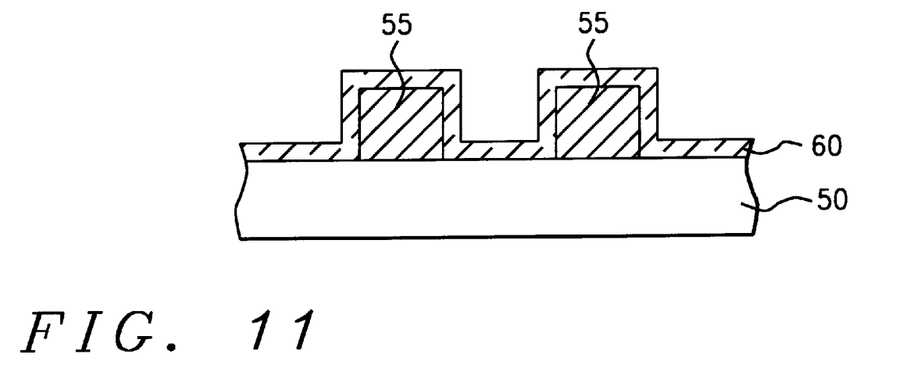
FIG. 11 shows a cross section after a PECVD oxide layer has been deposited.

FIG. 11 shows the deposition of a layer 60 of PECVD oxide over the exposed+of the metal lines 55 and over the exposed surface of the insulating layer 50.

Figure 12:
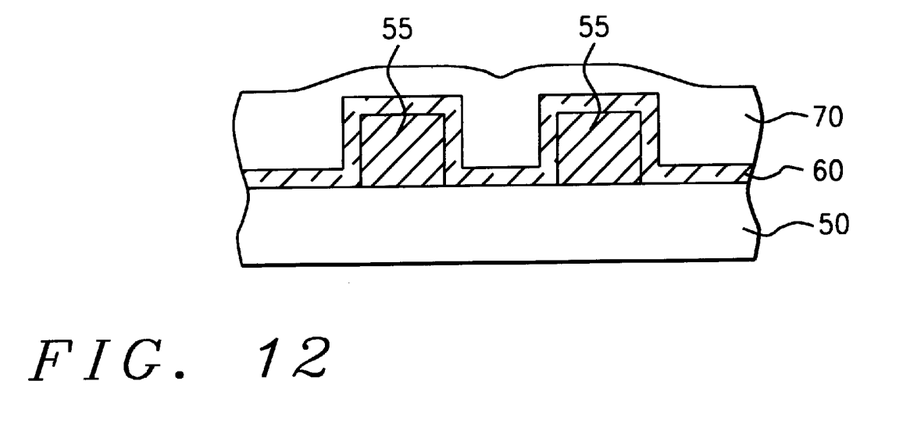
FIG. 12 shows a cross section after a layer of SOG has been deposited.

FIG. 12 shows the deposition of a layer 70 of SOG over the surface of the layer 60 of PECVD oxide.

Figure 13:
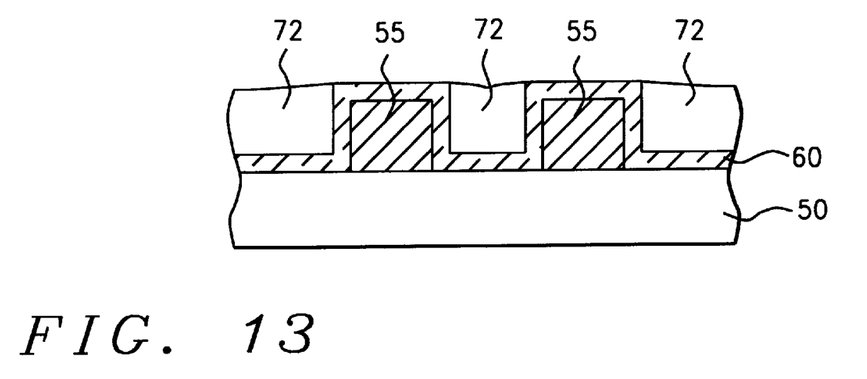
FIG. 13 shows a cross section after planarization of the layer of SOG.

FIG. 13 shows a cross section after layer 70 of SOG has been planarized. This planarization has been continued down to below the level of the top surface of the layer 60 of deposited PECVD oxide that is on top of the metal leads 55.

The planarization is a SOG total etchback and removes all SOG above the metal lines. Columns 72 of SOG are formed in this manner between the metal lines 55 and separated from these metal lines 55 be the deposited layer 60 of PECVD oxide.

Figure 14:
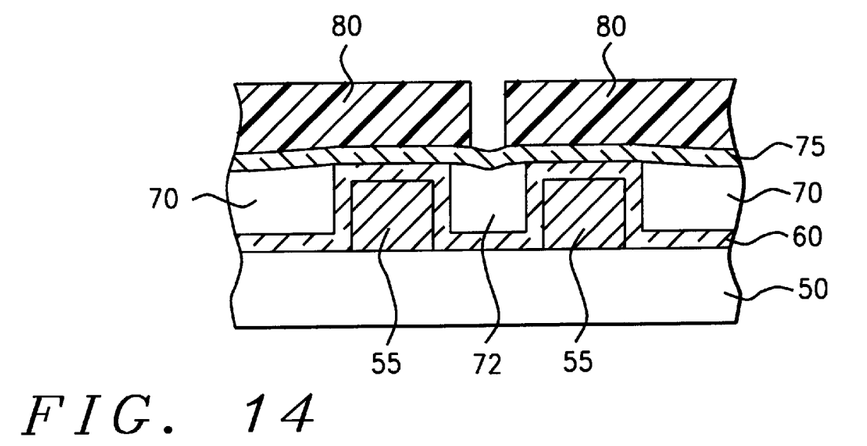
FIG. 14 shows a cross section after the deposition of a layer of PECVD oxide and the deposition and patterning of a layer of photoresist.

FIG. 14 shows a cross section after a layer 75 of PECVD oxide has been deposited over the surface of the planarized SOG. Also shown in FIG. 14 is the deposited and patterned layer 80 of photoresist. The patterning of the layer of photoresist opens small openings in the photoresist, about 0.1 um in size. These openings are aligned with the underlying columns of SOG.

Figure 15:
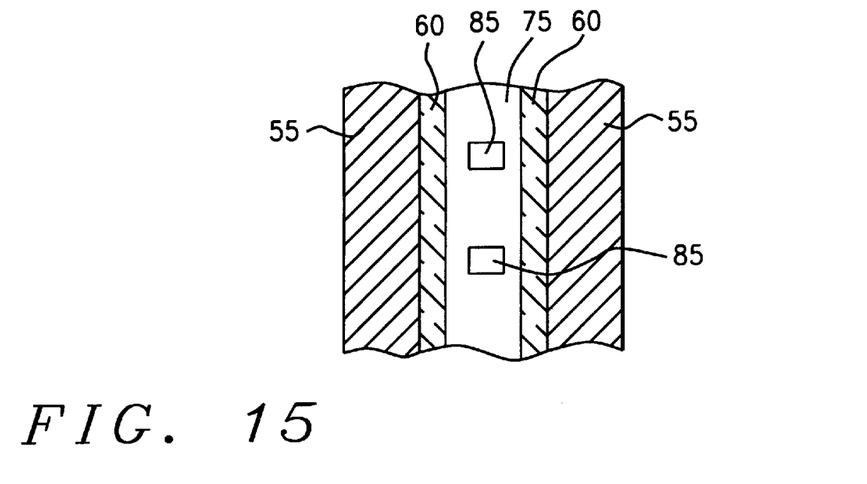
FIG. 15 shows a top view of the created openings in the layer of PECVD oxide.

FIG. 15 shows a top view of the openings 85 that are created in the PECVD layer 75 (FIG. 14), these openings are created by the process of dry etch of layer 75 of PECVD oxide. These openings 85 are aligned with the underlying columns 72 (FIG. 13) of SOG and are spaced in between the metal pattern 75. The alignment of the openings 85 allows for etching of the underlying columns of SOG, this etch is a SOG etch by vapor HF, the etch rate selectivity of SOG compared with PECVD oxide is larger than 100 so that the SOG can be etched away at a rapid rate without affecting the PECVD oxides 75 and 60.

Figure 16:
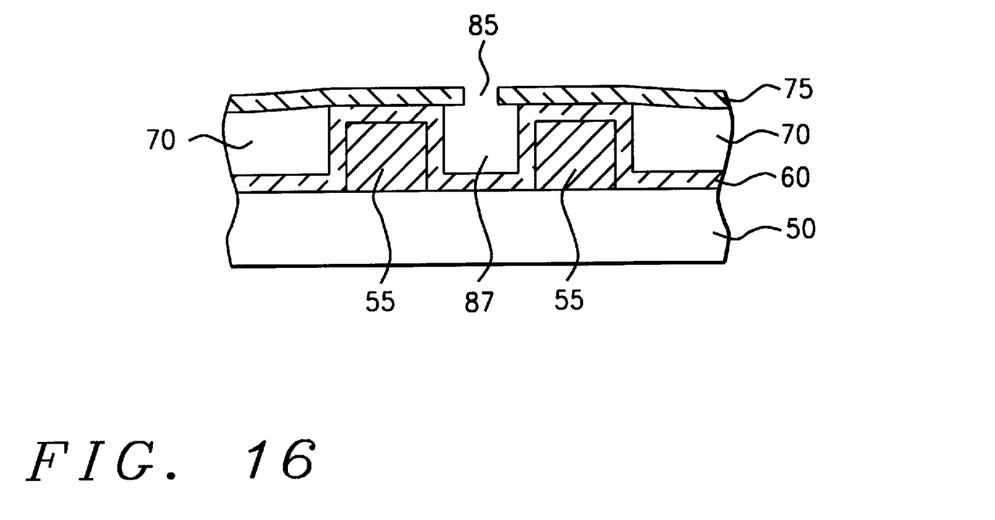
FIG. 16 shows a cross section after the photoresist has been removed.

FIG. 16 shows a cross section after the photoresist 80 (FIG. 14) has been removed from the layer 75 of PECVD oxide. Openings 85 are also indicated. The SOG has been removed from the intra-level dielectric openings 87 and has been replaced with air resulting in a dielectric constant of less than 1.001 for the intra-level dielectric between the metal lines 55. It is clear from FIG. 16 that the size of openings 85 and the thickness of the PECVD oxide layer 75 are interdependent. The thickness of the PECVD layer 75 is to be optimized such that adequate surface tension can be created in the subsequently to be deposited layer that overlays openings 85. In the absence of such surface tension, the subsequent to be deposited layer of material would penetrate opening 87 thereby defeating the object of the invention of creating air as a dielectric between the metal lines 55.

Figure 17:
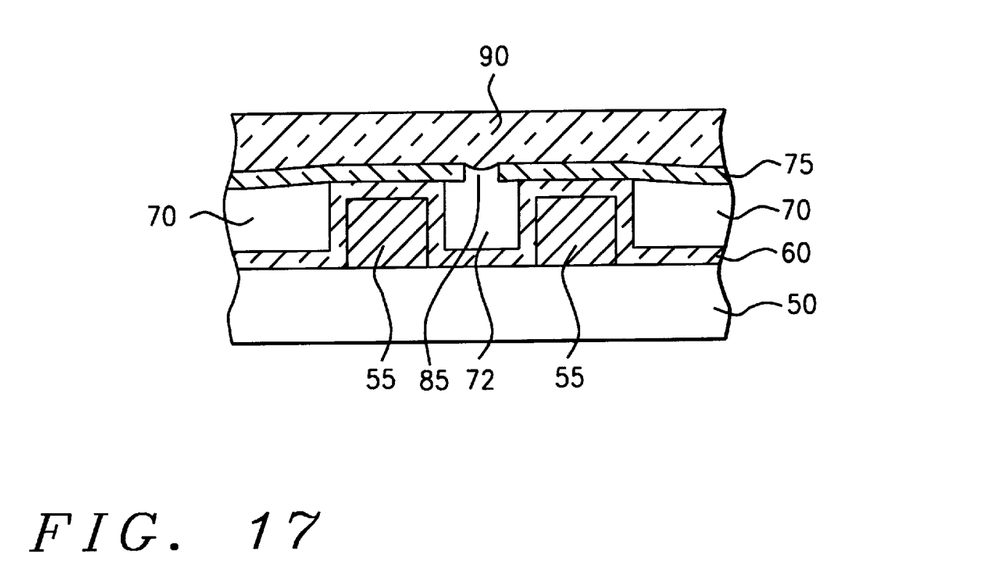
FIG. 17 shows a cross section after the final deposition of a dielectric layer.

FIG. 17 shows a cross section after the final deposition of a layer 90 of dielectric material over the layer 75 of PECVD oxide. This layer 90 of dielectric is deposited by spin coating preferably using a low dielectric constant material. The surface tension of the dielectric material that is present while the layer 90 is being deposited prevents the dielectric material from penetrating into the openings 87 thereby retaining the intra-level dielectric of air. As a final step, the deposited layer 90 of dielectric is cured.

It will be apparent, to those skilled in the art, that other embodiments, improvements, details and uses can be made consistent with the letter and spirit of the present invention and within the scope of the present invention, which is limited in its application only by the following claims, construed in accordance with the patent law, including the doctrine of equivalents.

What is claimed is:

1. A method for forming a semiconductor device having air regions, the method comprising the steps of:
   providing a base layer of material;
   forming a pattern of metal leads overlaying the base layer, the metal leads having a top and sidewalls with spacing between adjacent lines within said pattern of metal leads;
   depositing a layer of oxide over the top of said metal leads and on top of the exposed surface of said base layer;
   forming a layer of nitride over said layer of oxide;
   opening a trench through said layer of nitride and into said deposited layer of oxide down to a level not reaching said base layer of material;
   etching said oxide down to said base layer of material thereby also widening said trench;
   depositing a dielectric layer on top of said layer of nitride such that said dielectric layer dielectric does not penetrate said trench;
   planarizing said dielectric layer down through the top layer of said deposited layer of nitride;
   etching the remainder of said nitride; and
   depositing a dielectric to enclose said air gaps within said trench and within the areas of said remainder of said removed nitride.

2. The method of claim 1 wherein said base layer can be formed on top of a substrate or any other layer within the structure of a semiconductor wafer.

3. The method of claim 1 wherein etching said oxide down to said base layer of material thereby also widening said trench uses wet and/or isotropic etching techniques.

4. The method of claim 1 wherein said dielectric layer on top of said layer of nitride contains phosphosilicate glass.

5. The method of claim 1 wherein depositing a dielectric layer on top of said layer of nitride is a high pressure or low temperature CVD.

6. The method of claim 1 further comprising the step of forming a passivating layer on the sides of said metal leads after said step of forming said pattern of metal leads.

7. The method of claim 1 further comprising the step of forming a passivating layer between said pattern of metal leads and within the spacing between adjacent lines of said pattern of metal leads in addition to a passivating layer on the sides of said metal leads after said step of etching said pattern of metal leads.

8. The method of claim 6 wherein said passivating layer comprises a nitride.

9. The method of claim 7 wherein said passivating layer comprises a nitride.

10. The method of claim 1 wherein said base layer has been deposited over the substrate.

11. The method of claim 1 wherein said base layer has been deposited over the substrate and contains dielectric materials.

12. The method of claim 1 wherein said conductive leads consist of metal.

13. The method of claim 1 wherein said conductive leads consist of any semiconductor compatible conductive material.

14. The method of claim 1 wherein said dielectric layer on top of said layer of nitride comprises $SiO_2$, formed from TEOS or $SiH_4$ source in a plasma enhanced vapor deposition chamber.

15. A method for forming a semiconductor device having air regions, the method comprising the steps of:
   providing a base layer of material;
   forming a pattern of metal leads overlaying the base layer, the metal leads having a top and sidewalls with spacing between adjacent lines within said pattern of metal leads;
   depositing a layer of oxide over the top of said metal leads and on top of the exposed surface of said base layer;
   forming a layer of nitride over said layer of oxide;
   opening a trench through said layer of nitride and into said deposited layer of oxide down to a level not reaching said base layer of material;
   etching said oxide down to said base layer of material thereby also widening said trench;
   depositing a dielectric layer on top of said layer of nitride such that said dielectric layer dielectric does not penetrate said trench; and planarizing said dielectric layer down through the top layer of said deposited layer of nitride.

16. The method of claim 15 wherein said base layer can be formed on top of a substrate or any other layer within the structure of a semiconductor wafer.

17. The method of claim 15 wherein etching said oxide down to said base layer of material thereby also widening said trench uses wet and/or isotropic etching techniques.

18. The method of claim 15 wherein said dielectric layer on top of said layer of nitride contains phosphosilicate glass or TEOS.

19. The method of claim 15 wherein depositing a dielectric layer on top of said layer of nitride is a high pressure or low temperature CVD.

20. The method of claim 15 further comprising the step of forming a passivating layer on the sides of said metal leads after said step of forming said pattern of metal leads.

21. The method of claim 15 further comprising the step of forming a passivating layer between said pattern of metal leads and within the spacing between adjacent lines of said pattern of metal leads in addition to a passivating layer on the sides of said metal leads after said step of forming said pattern of metal leads.

22. The method of claim 20 wherein said passivating layer comprises a nitride.

23. The method of claim 21 wherein said passivating layer comprises a nitride.

24. The method of claim 15 wherein said base layer has been deposited over the substrate.

25. The method of claim 15 wherein said base layer has been deposited over the substrate and contains dielectric materials.

26. The method of claim 15 wherein said conductive leads consist of metal.

27. The method of claim 15 wherein said conductive leads consist of any semiconductor compatible conductive material.

28. The method of claim 15 wherein said step of depositing a dielectric layer on top of said layer of nitride consists of high speed spin on process using hydrogen silsesquioxane as dielectric material.

29. The method of claim 15 wherein said dielectric layer on top of said layer of nitride comprises $SiO_2$, formed from a TEOS or $SiN_4$ source in a plasma enhanced vapor deposition chamber.

30. A method for forming a semiconductor device having air regions, the method comprising the steps of:

providing a base layer of material;

forming a pattern of metal leads overlaying the base layer, the metal leads having a top and sidewalls with spacing between adjacent lines within said pattern of metal leads;

depositing a layer of PECVD oxide over the top of said metal leads and on top of the exposed surface of said base layer;

depositing a layer of SOG over said layer of PECVD oxide;

planarizing said layer of SOG down to the top surface of said deposited PECVD oxide thereby forming columns of SOG between said metal leads;

depositing a thin layer of PECVD oxide over said planarized surface of SOG;

opening holes through said layer of PECVD oxide;

etching said columns of SOG down to said base layer of material;

depositing a dielectric layer on top of said layer of PECVD oxide such that said dielectric layer dielectric does not penetrate said holes; and curing said layer of deposited dielectric.

31. The method of claim 30 wherein planarizing said layer of SOG is a SOG total etchback whereby said SOG is etched back down to the level of the top surface of said metal leads thereby removing all of the SOG above the plane of the top surface of the pattern of metal leads.

32. The method of claim 30 wherein said opening holes through said layer of PECVD oxide is patterning and etching said holes thereby applying a thin coating of photoresist whereby said holes are essentially aligned with said columns of SOG in between said pattern of metal leads whereby further said holes are reasonably populated as needed with a dimension of about 0.1 um.

33. The method of claim 30 whereby said opening holes is a dry etch and resist ashing process.

34. The method of claim 30 wherein said etching said columns of SOG is a selective SOG etch using vapor HF whereby the etch rate selectivity of SOG over PECVD oxide is larger than 100 thereby creating air gaps in between said metal leads.

35. The method of claim 30 wherein said depositing a dielectric layer on top of said layer of PECVD oxide is a spin coat process thereby using a low dielectric constant material.

* * * * *